(12) United States Patent
Visser

(10) Patent No.: US 6,396,124 B1
(45) Date of Patent: May 28, 2002

(54) SEMICONDUCTOR DEVICE

(75) Inventor: Hendrik Arend Visser, Nijmegen (NL)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/561,294

(22) Filed: Apr. 28, 2000

(51) Int. Cl.[7] .............................................. H01L 29/00
(52) U.S. Cl. ..................................... 257/557; 438/316
(58) Field of Search .................................. 257/648, 557, 257/549, 552, 556, 565, 575; 357/34, 48; 148/175

(56) References Cited

U.S. PATENT DOCUMENTS

| | | | | |
|---|---|---|---|---|
| 4,314,268 A | * | 2/1982 | Yoshioka et al. | ............... 357/48 |
| 4,505,766 A | * | 3/1985 | Nagumo et al. | ............ 148/175 |
| 5,107,320 A | * | 4/1992 | Iranmanesh | .................... 357/34 |
| 5,262,672 A | * | 11/1993 | Iranmanesh | ................. 257/648 |
| 5,493,149 A | * | 2/1996 | Jerome et al. | ............... 257/557 |

FOREIGN PATENT DOCUMENTS

JP          6269656 A      3/1987     ........... H01L/23/48

* cited by examiner

*Primary Examiner*—David Nelms
(74) *Attorney, Agent, or Firm*—Steven R. Bipen

(57) ABSTRACT

The invention relates to a semiconductor device comprising a semiconductor body (10) including, for example, a p-type substrate (11) and a PNP bipolar transistor having a collector (1), a base (2) and an emitter (3), which are each provided with a connection conductor (7, 8, 9). One or more of the connection conductors (7, 8, 9) extend over a part of an insulating layer (20) which covers the body (10) which contains, below said insulating layer (20), a further semiconductor region (4) of a conductivity type opposite to that of the substrate (11). A disadvantage of the known device is that it is less suitable for certain applications, such as power amplification. In a device according to the invention, a sub-region (4b) of the further semiconductor region which borders on the substrate (11) is provided with a higher doping concentration than the remainder (4a) of the further semiconductor region (4). In the known device, a low value of the interconnect capacitance can be achieved by providing the further region (4) with a low doping concentration. However, this may lead to complete depletion of said region (4), which implies that the equivalent loss resistance becomes zero. In the device according to the invention, on the one hand, a capacitance is connected in series to the insulating layer (20), which is sufficiently low to reduce the interconnect capacitance, while, on the other hand, an equivalent loss resistance of zero is precluded. Moreover, the transistor can be readily manufactured since the further region (4) can be manufactured simultaneously with the collector (1). Preferably, the substrate is provided with an additional connection conductor (12) on top of the body (10), close to the active region, said connection conductor being connected, for example, to the connection conductor (9) of the emitter (3).

5 Claims, 2 Drawing Sheets

SEMICONDUCTOR DEVICE

BACKGROUND OF THE INVENTION

The invention relates to a semiconductor device comprising a semiconductor body the surface of which is provided with an insulating layer and which comprises, in succession, a substrate of a first conductivity type, a first semiconductor region of a second conductivity type which is opposite to the first conductivity type, which semiconductor region forms a collector region of a bipolar transistor and is provided with a first connection conductor, a second semiconductor region of the first conductivity type, which forms a base region of the transistor and is provided with a second connection conductor, and a third semiconductor region of the second conductivity type which forms an emitter region of the transistor and is provided with a third connection conductor, at least one of the connection conductors extending over a part of the insulating layer below which there is a further semiconductor region of the second conductivity type. Such a device constitutes, or forms part of, for example an amplifier. The invention also relates to a method of manufacturing such a device.

A device of the type mentioned in the opening paragraph is known from United States patent specification U.S. Pat. No. 5,107,320, published on Apr. 21, 1992. FIG. 3 of said patent specification shows a substrate on which a bipolar transistor with a collector region, base region and emitter region is provided. The surface of the semiconductor body of the device is covered with an insulating layer over which a part of the connection conductors of the device extends. The capacitance between this part of the connection conductors and the substrate, the so-called interconnect capacitance, limits the speed of the transistor. Below the insulating layer and above the substrate there is a further semiconductor region of a conductivity type which is opposite to that of the substrate. The pn-junction thus formed forms an additional series capacitance with respect to the capacitance of the insulating layer. In this manner, an important reduction of the overall capacitance between the connection conductors and the substrate can be achieved.

A drawback of the known device resides in that it is less suitable for certain applications, particularly for use as or in a power amplifier.

SUMMARY OF THE INVENTION

Therefore, it is an object of the invention to provide a device which is very fast and which does not exhibit the above-mentioned drawback, or only to a limited extent, and which can suitably be used in or as a power amplifier. The invention also aims at providing a simple method of manufacturing said device. To achieve this, a device of the type mentioned in the opening paragraph is characterized in accordance with the invention in that a part of the further semiconductor region adjoining the substrate is provided with a doping concentration which is higher than that in the remaining part of the further semiconductor region.

The invention is based on the following surprising recognitions. In the first place, the recognition that a low doping concentration of the further semiconductor region does lead to a maximum reduction of the interconnect capacitance, but also that such a layer comprises relatively few charge carriers. During operation of the device this may lead to complete depletion of the further semiconductor region. In practice this means that a short-circuit occurs between the connection conductor and the substrate. The equivalent loss resistance then becomes 0 Ohm, which is undesirable, particularly for the output of a power amplifier wherein the voltage across this capacitance is very high. In the case of a high doping concentration of the further semiconductor region this drawback does not occur, but the pn-junction between this region and the substrate, which is relatively high in this case, leads to almost no reduction of the interconnect capacitance. By dividing the further semiconductor region into a (lower-level) part having a higher doping concentration and a (higher-level) part having a lower doping concentration, both problems, namely the problem of a high interconnect capacitance and the problem of too low an equivalent loss resistance can be precluded. By providing the lower-level part of the further semiconductor region with a higher doping concentration, it is achieved that the higher-level part can also fulfill the function of a lower-doped part of the collector region, so that both parts can be manufactured simultaneously. In addition, this construction also enables the higher-doped, lower-level part of the further semiconductor region to be manufactured at the same time as a higher-doped, lower-level part of the collector region. This is an important additional advantage. All this will be explained in greater detail hereinbelow.

In a preferred embodiment, the part of the collector region adjoining the substrate has a higher doping concentration than the rest of this region, and the doping concentration of the part of the further semiconductor region adjoining the substrate is lower than the doping concentration of the part of the collector region adjoining the substrate. This enables the collector region and the further semiconductor region to function optimally, as well as the part of the further semiconductor region adjoining the substrate to be manufactured at the same time as the part of the collector region adjoining the substrate, namely by making the lower-level part of the collector region extend, in a modulated manner, at the location of the further semiconductor region. This is achieved by dividing the lower-level part of the collector region into sub-regions at the location of the further semiconductor region. A suitable thermal treatment will cause these regions to merge, thereby forming a continuous homogeneous layer having a lower doping concentration than the lower-level part of the collector region. As a result, however, the doping concentration of the lower-level part of the further semiconductor region will be slightly laterally modulated. However, this does not interfere with the intended, above-discussed effects.

In a very favorable embodiment of a device in accordance with the invention, the semiconductor body is provided with another semiconductor region of the first conductivity type, which is recessed in said semiconductor body, and which is connected to the substrate, and provided with another connection conductor and situated, preferably, as close as possible to the active region of the transistor. In this manner, the above-mentioned losses which occur, in particular, when the device is used in or as a power amplifier are further limited in a very practical manner because the substrate resistance, which is connected in series to the interconnect capacitance (s), is as close to zero as possible. Such a construction is very surprising, particularly for a discrete transistor wherein the collector region generally coincides with the substrate, and for the intended purpose, i.e. minimizing the losses of a transistor.

Consequently, the device thus formed is very fast and can very suitably be used in or as a power amplifier, particularly for an end stage thereof.

A method of manufacturing a device in accordance with the invention, wherein, in a semiconductor body the surface of which is provided with an insulating layer and which is formed by means of a substrate of a first conductivity type, there are formed in a side-by-side relationship, a first semiconductor region of a second conductivity type, which is opposite to the first conductivity type, which forms a collector region of a bipolar transistor and is provided with a first connection conductor, a second semiconductor region of the first conductivity type which forms a base region of the transistor and is provided with a second connection conductor, and a third semiconductor region of the second conductivity type, which forms an emitter region of the transistor and is provided with a third connection conductor, at least one of the connection conductors extending over a part of the insulating layer below which a further semiconductor region of the second conductivity type is formed, characterized in accordance with the invention in that a part of the further semiconductor region adjoining the substrate is provided with a doping concentration which is higher than the doping concentration in the remaining part of the further semiconductor region. In this manner, a device in accordance with the invention is obtained in a simple manner.

Preferably, a part of the collector region adjoining the substrate is provided with a higher doping concentration than the remaining part of the collector region, which is partly formed by the further semiconductor region, and the doping concentration of the part of the further semiconductor region adjoining the substrate is chosen to be smaller than the doping concentration of the part of the collector region adjoining the substrate. The parts of the collector region adjoining the substrate and the further semiconductor region are preferably formed in the same process step. In accordance with the invention, this is achieved in that the part of the further semiconductor region adjoining the substrate is formed by a number of mutually separated subregions which are interconnected by means of a thermal treatment. In a preferred embodiment of a method in accordance with the invention, the semiconductor body provided with another semiconductor region, which is recessed therein, and which is of the first conductivity type and connected to the substrate, said semiconductor region being provided with another connection conductor and being positioned, preferably, as close as possible to the active region of the transistor.

These and other aspects of the invention will be apparent from and elucidated with reference to the embodiments described hereinafter.

DESCRIPTION OF THE PREFERRED EMBODIMENTS

Figure 1:
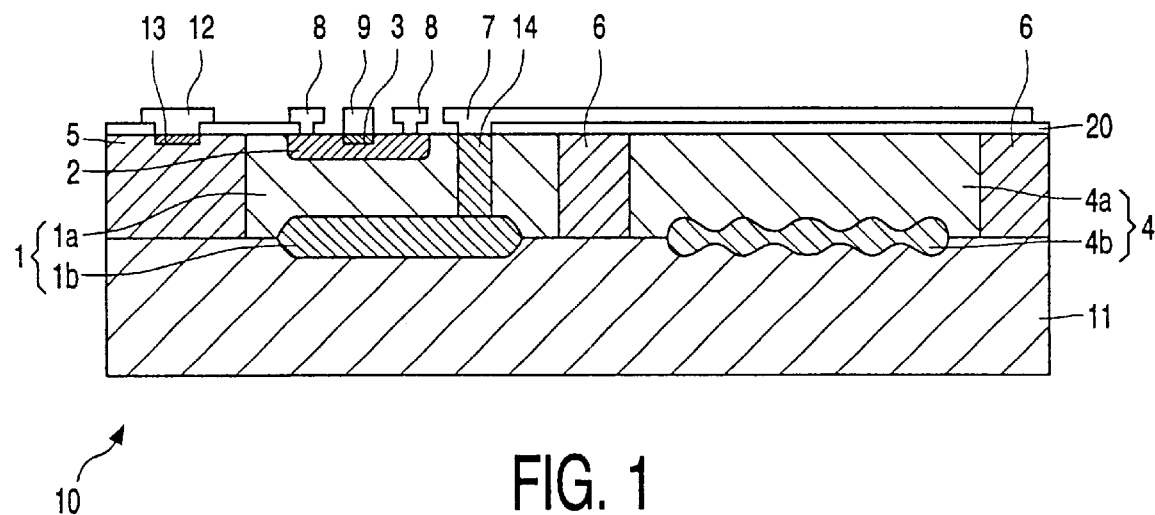
FIG. 1 is a diagrammatic, cross-sectional view, at right angles to the thickness direction, of a semiconductor device in accordance with the invention, and FIGS. 2 through 4 also are diagrammatic, cross-sectional views, at right angles to the thickness direction, of the device shown in FIG. 1 at successive stages in the manufacturing process using an embodiment of a method in accordance with the invention. The Figures are diagrammatic and not drawn to scale, particularly the dimensions in the thickness direction being exaggerated strongly for clarity. Semiconductor regions of the same conductivity type are generally hatched in the same direction. Corresponding regions are indicated by the same reference numeral as much as possible.

FIG. 1 is a diagrammatic, cross-sectional view, at right angles to the thickness direction, of a semiconductor device in accordance with the invention. The device comprises a semiconductor body 10 of silicon comprising a substrate 11 of a first conductivity type, here the p-type, which, in this case, is lightly doped with boron atoms and has a specific resistance of 20 Ωcm. On said substrate there is a first semiconductor region 1 of the second conductivity type, here the n-type, which, in this case, comprises a lower-level part 1a having a high doping concentration, here $10^{18}$ at/cm3, and a higher-level part 1b having a lower doping concentration, here $5 \times 10^{15}$ at/cm$^3$, said semiconductor region forming a collector region 1 of a bipolar transistor. The thicknesses of the parts 1a, 1b of the collector 1 are approximately 0.3 and 0.7 μm, respectively. By means of a recessed, heavily doped n-type semiconductor region 14, the collector region 1 is connected to a first connection conductor 7 which extends (partly), here over a distance of several tenths of a millimeter, over the silicon-dioxide layer 20-covered surface of the semiconductor body 10. Adjacent to the first semiconductor region 1 there is a second semiconductor region 2 of the second conductivity type, here the p-type, which forms a base region 2 of the transistor. The base region 2 has a thickness of approximately 0.3 μm, a doping concentration of approximately $10^{18}$ at/cm$^3$ and is provided with a second connection conductor 8. Adjacent to the base region 2 there is also a third semiconductor region 3 of the first conductivity type, i.e. here the n-type, which forms an emitter region 1 of the transistor and is provided with a third connection conductor 9. The emitter region 2, which in this case comprises polycrystalline silicon, is of a customary thickness and provided with a customary doping concentration, here for example several tenths of a micrometer and approximately $10^{19}$ at/cm$^3$, respectively. At the location where the first connection conductor 7 extends over the surface, a further semiconductor region 4 of the second conductivity type, i.e. here the p type, having the same thickness and doping concentration as the part 1a of the collector region 1 extends below the insulating layer.

In accordance with the invention, a part 4b of the further semiconductor region 4 adjoining the substrate 11 is provided with a doping concentration which is higher than that in the remaining part 4a of the further semiconductor region. By virtue thereof, the pn-junction between the substrate 11 and the further semiconductor region 4 has, on the one hand, a capacitance of a relatively small value suitable for reducing the so-called interconnect capacitance. In the absence of the lower-level, higher-doped part 4b, the capacitance of said pn-junction would be lower still, and hence more suitable for reducing the interconnect capacitance, however, in that case the further semiconductor region 4 could become entirely depleted during operation, which means in practice that a short-circuit would occur between the first connection conductor 7 and the substrate 11. This is very undesirable, particularly, when the transistor is used in or as a power amplifier, which application involves a very high voltage across this capacitance. On the other hand, such a construction of the further semiconductor region 4 enables the transistor to be readily manufactured. The measure in accordance with the invention enables the manufacture of the further semiconductor region 4 to take place substantially synchronously with the manufacture of the collector region 1. All this will be explained in greater detail hereinbelow.

In this example, the doping concentration of the lower-level part 4b of the further semiconductor region 4 is approximately $10^{17}$ at/cm$^3$. This value thus lies between the doping concentration values of the lower-level part 1b of the collector region 1, which has the important advantage that the capacitance of the pn-junction between the substrate 11 and the further semiconductor region is not so high that the intended reduction of the interconnect capacitance can no longer be achieved. Such a doping concentration is preferably achieved, as described in this example, by forming the lower-level part 4b of the further semiconductor region 4 so as to be a series of smaller, mutually separated sub-regions 4b, here in the form of a pattern of square sub-regions 4. A suitable thermal treatment causes these sub-regions to merge into a continuous region 4b whose doping concentration in a direction, here in two mutually perpendicular directions, is modulated parallel to the surface and effectively reduced with respect to the doping concentration of the originally formed sub-regions. In this manner, the lower-level part 4b of the further semiconductor region 4 can be readily manufactured at the same time as the lower-level part 1b of the collector region 1.

The bipolar transistor is further surrounded by another semiconductor region 5, 6, of the first conductivity type, i.e. here the p-type, which is recessed in the semiconductor body 10 and connected to the substrate 11, which other semiconductor region is provided with another connection conductor 12 and is preferably situated, as in this case, in a part 5 of the other semiconductor region 5, 6, which part is situated as close as possible to the active region of the transistor, here at a distance of approximately $2 \mu$ from the active region of the transistor, i.e. the part of the transistor situated above the lower-level part 1b of the collector region 1. This measure too contributes substantially to the achievement of the intended goal of the invention, namely to limit the losses when a device in accordance with the invention is used in or as a power amplifier. This contribution consists in that this measure causes the resistance of the substrate 11, which is connected in series to the interconnect capacitance(s), is as close to zero as possible. The other semiconductor region 5, 6 has to be connected to a low-impedance potential. In the device in accordance with this example, i.e. an NPN transistor serving as a power amplifier, said other semiconductor region is the emitter region 3.

In this example, the dimensions of the active region of the transistor are approximately $30 \times 300 \ \mu m^2$. The dimensions of the other regions are adapted thereto. The dimensions of the further semiconductor region 4 are adapted, for example, to the distance between the collector plug 14 and a connection surface, which is not shown in the Figure. In practice, this distance ranges between several tens of micrometers to 1 mm. Hereinbelow, it will be described how the device of this example is manufactured.

Figure 2:
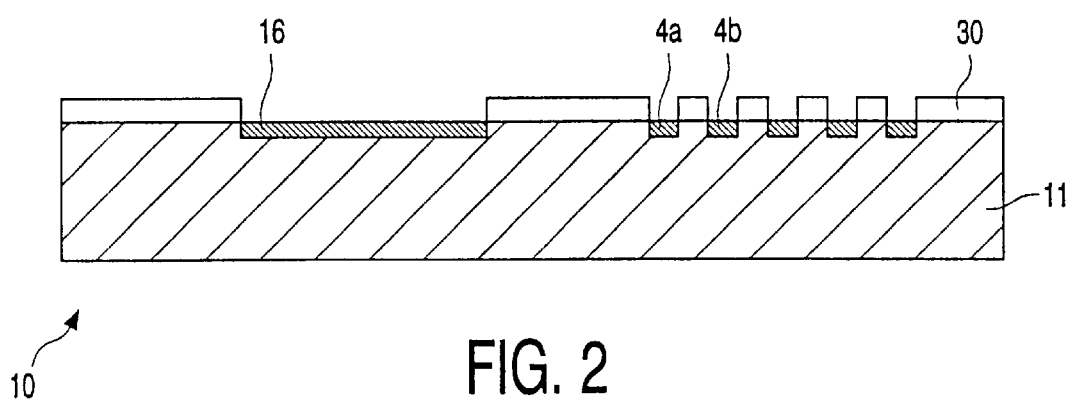
Figure 3:
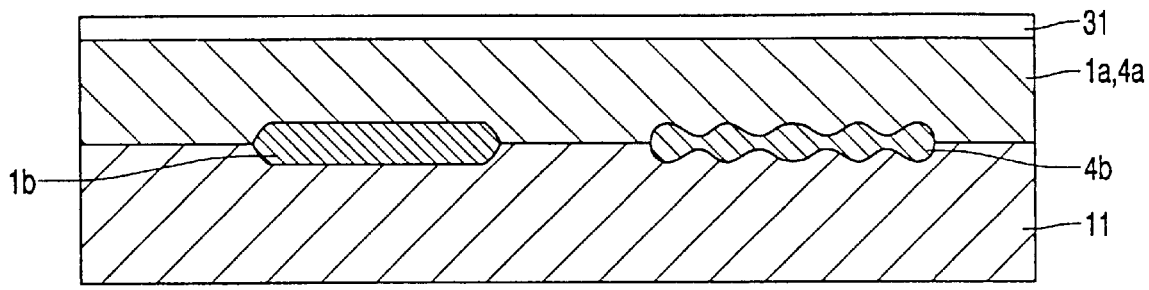
Figure 4:
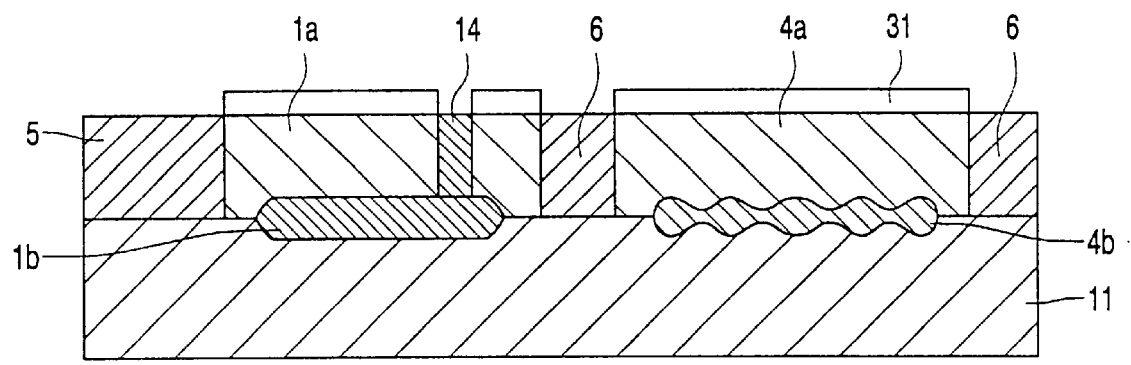

FIGS. 2 through 4 also are diagrammatic, cross-sectional views, at right angles to the thickness direction, of the device shown in FIG. 1 at successive stages in the manufacturing process, using an embodiment of a method in accordance with the invention. A p-type substrate 11 (see FIG. 2) which forms part of a semiconductor body 10 is provided with a mask layer 30 of a photoresist which is patterned by means of photolithography. Subsequently, an n-type, 30 $\mu$m wide first semiconductor region 1b and a series of n-type further semiconductor regions 4b, each having a dimension of $1 \times 1$ $\mu m^2$ and arranged at mutual intervals of 2 $\mu$m are formed in a single implantation step in the substrate 11. The implantation of arsenic ions takes place, in this case, at an energy of 100 keV and a flux of $5 \times 10^{15}$ at/cm$^2$. Subsequently, the mask layer 30 is removed and the substrate 11 is cleaned. Next, (see FIG. 3), the substrate 11 is provided with an n-type epitaxial layer 1a, 4a. In this example, this is carried out at a temperature such that the sub-regions 4b merge into a further semiconductor region 4b whose doping concentration is lower than that of the semiconductor region 1b which forms a lower-level part 1b of a collector region 1 of the bipolar transistor to be formed. The surface of the semiconductor body 10 is subsequently provided with an insulating layer 31 by means of thermal oxidation. This thermal step further contributes to the above-mentioned merger of the sub-regions 4b. A pattern is formed in the insulating layer 31 (see FIG. 4) by means of photolithography and etching. In this manner a mask layer 31 is obtained by means of which a recessed n-type semiconductor region 14 is formed, which contacts the lowest part 1b of the collector region 1, and another p-type semiconductor region 5, 6, which is also recessed, and which makes contact with the substrate 11, which surrounds the active region 1a of the transistor to be formed as well as a higher-situated part 4a of the further semiconductor region 4. The recessed region 14 is formed by means of a first ion implantation, the recessed region 5, 6 is formed by means of a second ion implantation. During the formation of the recessed region 14, the opening in the mask layer 31 for forming the other recessed region 5, 6 is, of course, either not (yet) formed or covered, for example with photoresist. Implantation energy, flux and the subsequent temperature treatment are chosen in a customary manner. The bipolar transistor (see FIG. 1) can further be completed in various ways. In this example, after the formation of an opening in the insulating layer 21, the base region 2 is formed by providing, and subsequently locally removing, a first polycrystalline p-type silicon layer 2. After covering the base region 2 with an insulating layer, and after the formation of an opening therein, the emitter region 3 is formed by providing, and subsequently locally removing, a second polycrystalline, in this case n-type, silicon layer 2. After the surface of the semiconductor body 10 has been completely covered again with the insulating layer 21, openings are formed therein in a customary manner, and the connection conductors 7, 8, 9 and 12 are customarily provided. Below the connection conductor 12 of the substrate 11 there is formed, in this case, a contact resistance-reducing, recessed, p-type connection region 13. The width of the connection conductors 7, 8, 9 and 12 can be chosen to be relatively large, such as, in this case, the width of the connection conductor 7 of the collector 1 which has a width of 20 $\mu$m in this case, which is a factor of 10 larger than the smallest, still customary, width. In this case, the thickness of this connection conductor 7 is approximately 1 $\mu$m. By virtue thereof, the transistor obtained can very suitably be used as a power amplifier. By virtue of the invention, the interconnect capacitance is still very low in spite of the relatively wide connection conductors 7, 8, 9, 12. Thus, the (power) transistor obtained is also very fast.

The invention is not limited to the example described herein, and, within the scope of the invention, many modifications and variations are possible to those skilled in the art. For example, for the various (semiconductor) regions or layers compositions and thicknesses may be chosen which differ from those used in the example. Among other things, the sub-regions of the lower-level part of the further semiconductor region may have a shape other than square and they do not have to be arranged in a matrix configuration with respect to each other. Also deposition techniques or application methods other than those mentioned herein may be used. Thermal oxidation may be replaced by deposition of an oxide from the gas phase. The deposition technique may also replace one or more implantations.

The bipolar transistor may have different structures. For example, the base region may comprise, apart from polycrystalline silicon, monocrystalline silicon. Also the manufacture may be modified in various ways. Instead of applying a layer, epitaxially or otherwise, and subsequently removing it partly, it is alternatively possible to locally selectively apply the desired layer. Also the geometry of the regions may be chosen to be different, if desired. For example, to enhance a high permissible power, the emitter region, but also the base region, may be in the shape of a comb. The device in accordance with the invention may alternatively be a device which is more complex than a single (discrete) bipolar transistor. The device may comprise a number of different active or passive components, so that a small circuit may be integrated in the essentially discrete component.

What is claimed is:

1. A semiconductor device comprising a semiconductor body (10) the surface of which is provided with an insulating layer (20) and which comprises, in succession, a substrate (11) of a first conductivity type, a first semiconductor region (1) of a second conductivity type which is opposite to the first conductivity type, which semiconductor region forms a collector region of a bipolar transistor and is provided with a first connection conductor (7), a second semiconductor region (2) of the first conductivity type, which forms a base region of the transistor and is provided with a second connection conductor (8), and a third semiconductor region (3) of the second conductivity type which forms an emitter region of the transistor and is provided with a third connection conductor (9), at least one of the connection conductors (7, 8, 9) extending over a part of the insulating layer (20) below which there is a further semiconductor region (4) of the second conductivity type, characterized in that a part (4b) of the further semiconductor region (4) adjoining the substrate (11) is provided with a doping concentration which is higher than that in the remaining part (4a) of the further semiconductor region (4).

2. A semiconductor device as claimed in claim 1, characterized in that a part (1b) of the collector region adjoining the substrate (11) has a higher doping concentration than the remaining part (1a) of the collector region which forms part of the further semiconductor region (4), and the doping concentration of the part (4b) of the further semiconductor region (4) adjoining the substrate (11) is smaller than the doping concentration of the part (1b) of the collector region (1) adjoining the substrate.

3. A semiconductor device as claimed in claim 1, characterized in that the part (4b) of the further semiconductor region (4) adjoining the substrate (11) has a doping profile which is modulated in a direction parallel to the surface of the semiconductor body (10).

4. A semiconductor device as claimed in claim 1, characterized in that the semiconductor body (10) is provided with another semiconductor region (5) of the first conductivity type, which is recessed in said semiconductor body, and which is connected to the substrate (11), and provided with another connection conductor (12) and situated, preferably, as close as possible to the active region of the transistor.

5. A semiconductor device as claimed in claim 1, characterized in that the transistor forms part of a power amplifier.

* * * * *